United States Patent
Carr et al.

(10) Patent No.: US 10,930,812 B1
(45) Date of Patent: Feb. 23, 2021

(54) METHOD FOR FABRICATING A PHOTOVOLTAIC DEVICE USING COMPUTER-CONTROLLED SYSTEM

(71) Applicant: The United States of America as represented by the Administrator of NASA, Washington, DC (US)

(72) Inventors: John A Carr, Lacey's Spring, AL (US); Furman VanDrake Thompson, II, Madison, AL (US); Austin T Bumbalough, Huntsville, AL (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 16/691,219

(22) Filed: Nov. 21, 2019

(51) Int. Cl.
*H01L 31/18* (2006.01)

(52) U.S. Cl.
CPC ........ *H01L 31/188* (2013.01); *H01L 31/1864* (2013.01); *H01L 31/1868* (2013.01)

(58) Field of Classification Search
CPC ... H01L 31/188; H01L 31/18; H01L 31/1864; H01L 31/1868; H01L 31/206; H01L 31/208; H05K 3/125; H05K 3/1241
See application file for complete search history.

(56) References Cited

U.S. PATENT DOCUMENTS

| | | | | |
|---|---|---|---|---|
| 8,614,559 B2* | 12/2013 | Kassow | ............ | B25J 9/1671 318/568.11 |
| 8,779,715 B2* | 7/2014 | Kassow | ............ | B25J 9/1671 318/568.2 |
| 2007/0169813 A1* | 7/2007 | Robinson | ............ | C23C 18/1204 136/262 |
| 2009/0107550 A1* | 4/2009 | Van Duren | ......... | C23C 18/1287 136/262 |
| 2015/0013596 A1* | 1/2015 | Matsumoto | ............ | B05C 1/02 118/56 |
| 2016/0163910 A1* | 6/2016 | Gonzalez | ............ | H01L 31/0504 438/80 |
| 2018/0122979 A1* | 5/2018 | Zajac | ............ | H01L 31/043 |
| 2018/0174876 A1* | 6/2018 | Sung | ............ | H01L 21/67742 |

* cited by examiner

*Primary Examiner* — Earl N Taylor
(74) *Attorney, Agent, or Firm* — Helen M. Gaius; James J. McGroary (57) ABSTRACT

A fully automated fabrication method and system utilizing a single additive manufacturing platform to fabricate solar cell panels without human-touch labor. The system includes a computer and a robotic arm having a machine vision device and a tool changer to which tools are releasably secured. In an exemplary embodiment, the fabrication method uses pre-fabricated substrates wherein the computer controls the robotic arm to deposit an adhesive layer on a pre-fabricated substrate and thereafter place solar cells on the adhesive layer. The solar cells become bonded to the substrate when the adhesive layer cures. The computer then controls the robotic arm to print electrical connections and electrical bus bars on the substrate with electrically conductive ink in order to electrically connect the solar cells. After the electrically conductive ink cures, the computer controls the robotic arm to spray an encapsulating material over the solar cells and substrate.

20 Claims, 5 Drawing Sheets

METHOD FOR FABRICATING A PHOTOVOLTAIC DEVICE USING COMPUTER-CONTROLLED SYSTEM

ORIGIN OF THE INVENTION

The invention described herein was made by employees of the United States Government and may be manufactured and used by or for the Government of the United States of America for governmental purposes without the payment of any royalties thereon or therefor.

CROSS-REFERENCES TO RELATED PATENT APPLICATIONS

None.

FIELD OF THE INVENTION

The present invention relates to a method for fabricating a photovoltaic device using a computer-controlled system.

BACKGROUND

The demand for solar energy has increased significantly over the last several years. Solar energy is now being used extensively to supply energy in the fields of manufacturing, aerospace and defense. Solar energy has also become an important energy supplement for homes. New uses for solar energy are continuously being discovered and developed. Accordingly, the demand for solar cell panels and photovoltaic devices is constantly increasing. However, conventional manufacturing techniques for fabricating solar cell panels and arrays are labor intensive, time consuming, inefficient and expensive. For example, many conventional manufacturing techniques utilize separate individual fabrication steps that are completed at different times or possibly different locations. In one conventional manufacturing technique of a photovoltaic device, metal foil solar cell sheets and substrate sheets are fabricated separately and then, in a separate step, are laminated together. In another separate step, electrical connections between solar cells are made via sintering, soldering, welding, electrical adhesive, etc. Other conventional techniques use a conventional evaporative technique to form the electrical connections on the solar cell panel instead of sintering, soldering, welding or electrical adhesives. In some conventional techniques, the substrates are pre-manufactured and already have printed circuits or interconnections formed thereon. In many instances, such pre-manufactured substrates are fabricated at one location and then transported to a second location where the solar cell arrays are being fabricated. If the substrates or solar cells are fabricated in situ, then the typical conventional deposition techniques that are used are costly, less flexible, and require high temperatures. In other conventional techniques, a backing substrate is manually placed over solar cells. Furthermore, many conventional fabrication processes do not include encapsulating the finished solar cell array. In many instances, the finished solar cell arrays remain un-encapsulated. If the finished solar cell arrays are encapsulated, typical conventional encapsulating methods utilize lamination or evaporative techniques that are time consuming, high cost and require complex tooling. All of these conventional fabrication steps involve a significant amount of human labor, are time consuming, expensive and inefficient and are not suited to produce high volumes of high quality photovoltaic devices at low costs. Fabricating high-quality low cost solar cell arrays in an efficient manner is becoming more of a challenge as the demand and size of solar cell arrays or panels continues to increase.

What is needed is a new and improved method for fabricating photovoltaic devices, such as solar cell arrays or panels, that eliminates the problems and disadvantages associated with conventional techniques and method for fabricating photovoltaic devices.

SUMMARY OF THE INVENTION

The present invention is directed to a fully-automated manufacturing method utilizing a single, mobile, scalable, platform for the additive manufacturing of an entire photovoltaic device, such as a solar cell array or panel, without human-touch labor. All steps of this manufacturing method are automatically implemented on the same platform and in situ via a programmed robotic arm.

According to one aspect of the present invention there is provided a method for fabricating a photovoltaic device using a computer-controlled system. The system comprises a first tool comprising a pneumatically actuated first dispensing device, a supply of a substantially liquid curable first material and a device to pick up components that are to be used in the photovoltaic device, a second tool comprising a pneumatically actuated second dispensing device and a supply of a liquid curable second material that is electrically conductive, a heated platen having a work surface for receiving components that are to be used in the photovoltaic device, a pressurized air source to provide pressurized air, a manifold in pneumatic communication with the pressurized air source to control application of pressurized air to the first dispensing device and the second dispensing device and a robotic device having a vision system. The robotic device and the first tool and the second tool are configured to allow the first tool and second tool to be removably secured to the robotic device. The system further comprises a computer to control the manifold and the robotic device. The method comprises the steps of: controlling the robotic device to use the first tool to pick up a substrate and place the substrate on the work surface of the heated platen, controlling the manifold to allow pressurized air to flow to the first tool to actuate the first dispensing device to allow the first material to exit the first dispensing device and controlling the robotic arm to maneuver in a pattern so as to allow the first material to be deposited upon the top surface of the substrate, controlling robotic device to use the first tool to place at least one thin film solar cell on the first material that has been deposited on the substrate, controlling the manifold to allow pressurized air to flow to the first tool to actuate the first dispensing device to allow the additional amounts of first material to exit the first dispensing device and controlling the robotic device to maneuver in a pattern so as to allow the additional amounts of first material to be deposited about the perimeter of the at least one thin film solar cell, curing the first material with heat provided by the heated platen in order to allow the at least one thin film solar cell to become bonded and sealed to the substrate, controlling the robotic device to release the first tool and engage the second tool, controlling the manifold to allow pressurized air to flow to the second tool to actuate the second dispensing device so as to allow the second curable material to exit the second dispensing device and controlling the robotic arm to maneuver in a pattern so as to allow the second material to be deposited upon cured additional amounts of the first material so as to form at least one electrically conductive trace that is electrically coupled to the thin film solar cell, curing the second material with heat provided by the heated platen, controlling the robotic device to release the second tool and engage the first tool, controlling the manifold to allow pressurized air to flow to the first tool to actuate the first dispensing device to apply a protective coating of the first material over the at least one thin film solar cell and the electrically conductive trace, and curing the protective coating of the first material using heat provided by the heated platen.

According to another aspect of the present invention, there is provided a method for fabricating a photovoltaic device using a computer-controlled system. The system comprises a first tool comprising a pneumatically actuated first dispensing device, a supply of a substantially liquid curable first material and a device to pick up components that are to be used in the photovoltaic device, a second tool comprising a pneumatically actuated second dispensing device and a supply of a liquid curable second material that is electrically conductive, a heated platen having a work surface for receiving components that are to be used in the photovoltaic device, a pressurized air source to provide pressurized air, a manifold in pneumatic communication with the pressurized air source to control flow of pressurized air to the first dispensing device and the second dispensing device and a robotic device having a vision system. The robotic device and the first tool and the second tool are configured to allow the first tool and second tool to be removably secured to the robotic device. The system further comprises a computer to control the manifold and the robotic device. The method comprises the steps of: controlling the robotic device to use the first tool to pick up a carrier and place the carrier on the work surface of the heated platen, controlling the manifold to allow pressurized air to flow to the first tool to actuate the first dispensing device to allow the first material to exit the first dispensing device and controlling the robotic arm to maneuver in a pattern so as to allow the first material to be deposited upon the top surface of the carrier, curing the first material that was deposited upon the top surface of the carrier with the heated platen so as to form a substrate having a top surface, controlling the manifold to allow pressurized air to flow to the first tool to actuate the first dispensing device to allow the first material to exit the first dispensing device and controlling the robotic arm to maneuver in a pattern so as to allow a layer of the first material to be deposited upon the top surface of the substrate, controlling robotic device to use the first tool to place at least one thin film solar cell on the layer of the first material, controlling the manifold to pressurized air to flow to the first tool to actuate the first dispensing device to allow additional amounts of the first material to exit the first dispensing device and controlling the robotic device to maneuver in a pattern so as to allow the additional amounts of the first material to be deposited about the perimeter of the at least one thin film solar cell, curing the first material with heat provided by the heated platen in order to allow the at least one thin film solar cell to become bonded and sealed to the substrate, controlling the robotic device to release the first tool and engage the second tool, controlling the manifold to allow pressurized air to flow to the second tool to actuate the second dispensing device so as to allow the second material to exit the second dispensing device and controlling the robotic arm to maneuver in a pattern so as to allow the second material to be deposited upon cured additional amounts of the first material so as to form at least one electrically conductive trace that is electrically coupled to the thin film solar cell, curing the second material with heat provided by the heated platen, controlling the robotic device to release the second tool and engage the first tool, controlling the manifold to allow pressurized air to flow to the first tool to actuate the first dispensing device to apply a protective coating of the first material over the at least one thin film solar cell and the electrically conductive trace; and curing the protective coating of the first material using heat provided by the heated platen.

According to a further aspect of the present invention, there is provided a method for fabricating a photovoltaic device using a computer-controlled system. The system comprises a first tool comprising a pneumatically actuated first dispensing device, a supply of a substantially liquid curable first material and a device to pick up components that are to be used in the photovoltaic device, a second tool comprising a pneumatically actuated second dispensing device and a supply of a liquid curable second material that is electrically conductive, a third tool comprising a pneumatically actuated third dispensing device having a supply of a liquid comprising a solvent, a heated platen having a work surface for receiving components that are to be used in the photovoltaic device, a pressurized air source to provide pressurized air, a manifold in pneumatic communication with the pressurized air source to control the flow of pressurized air to the first dispensing device, the second dispensing device and the third dispensing device and a robotic device having a vision system. The robotic device and the first tool, the second and third tool are configured to allow the first tool, the second tool and the third tool to be removably secured to the robotic device. The system further comprises a computer to control the manifold and the robotic device. The method comprises the steps of: controlling the robotic device to use the first tool to pick up a substrate made from a solid third material and place the substrate on the work surface of the heated platen, controlling the manifold to allow flow of pressurized air to the third tool to actuate the third dispensing device to allow the liquid comprising the solvent to exit the third dispensing device and controlling the robotic device to maneuver in a pattern so as to cause the liquid comprising the solvent to be deposited upon the top surface of the substrate in order to dissolve and liquefy the solid third material so as to form a liquid bed comprising the liquefied third material and the liquid comprising the solvent, controlling the robotic device to release the third tool and engage the first tool, controlling robotic device to use the first tool to place at least one thin film solar cell on the liquid bed, evaporating the solvent in the liquid bed and curing the liquefied third material with the heated platen so that the at least one thin film solar cell becomes integrated into the top surface of the substrate, controlling the robotic device to release the first tool and engage the second tool, controlling the manifold to allow flow of pressurized air to the second tool to actuate the second dispensing device so as to allow the second material to exit the second dispensing device and controlling the robotic arm to maneuver in a pattern so as to allow the second material to be deposited upon the substrate so as to form at least one electrically conductive trace that is electrically coupled to the at least one thin film solar cell, curing the second material with heat provided by the heated platen, controlling the robotic device to release the second tool and engage the first tool, controlling the manifold to allow flow of pressurized air to the first tool to actuate the first dispensing device to apply a protective coating of the first material over the at least one thin film solar cell and the electrically conductive trace, and curing the protective coating of the first material using heat provided by the heated platen.

Certain features and advantages of the present invention have been generally described in this summary section. However, additional features, advantages and embodiments are presented herein or will be apparent to one of ordinary skill of the art in view of the drawings, specification and claims hereof. Accordingly, it should be understood that the scope of the invention shall not be limited by the particular embodiments disclosed in this summary section.

DETAILED DESCRIPTION OF EXEMPLARY EMBODIMENTS OF THE INVENTION

As used herein, the terms "comprises", "comprising", "includes", "including", "has", "having" or any other variation thereof, are intended to cover a non-exclusive inclusion. For example, a process, method, article or apparatus that comprises a list of elements is not necessarily limited to only those elements, but may include other elements not expressly listed or inherent to such process, method, article or apparatus.

It is to be understood that throughout this description, terms such as "vertical", "horizontal", "top", "bottom", "upper", "lower", "middle", "above", "below" and the like are used for convenience in identifying relative locations of various components and surfaces relative to one another in reference to the drawings and that the system of the present invention may be installed and used in substantially any orientation so that these terms are not intended to be limiting in any way.

Approximating language, as used herein throughout the specification and claims, may be applied to modify any quantitative representation that could permissibly vary without resulting in a change in the basic function to which it is related. Accordingly, a value modified by a term such as "about" or "approximately" is not limited to the precise value specified.

As used herein, the term "processor" includes, for example, circuits such as an ASIC (Application Specific Integrated Circuit), portions or circuits of individual processor cores, entire processor cores, individual processors, central processing units (CPU), signal processors having analog-to-digital conversion circuitry, programmable hardware devices such as field programmable gate array (FPGA) and or larger portions of systems that include multiple processors.

As used herein, the term "computer", includes any of various types of computing or processing systems, including a personal computer (PC) system, mainframe computer system, workstation, network appliance, Internet appliance, personal digital assistant (PDA), personal communication device, smart phone, tablet and any other device (or combination of devices) having one or more processors that executes instructions from a memory medium.

As used herein, the terms "memory medium" or "memory" include non-transitory computer readable storage mediums and any of various types of memory devices or storage devices, such an installation medium, e.g., a CD-ROM, floppy disks, or tape device. "Memory medium" also includes a computer system memory or random access memory, such as DRAM, DDR RAM, SRAM, SDRAM, EDO RAM, Rambus RAM, and non-volatile memory such as a Flash, magnetic media, hard drive, optical storage, registers or other similar types of memory elements. "Memory medium" may include other types of memory as well or combinations thereof. The term "memory medium" may include two or more memory mediums which may reside in different locations, e.g. in different processing elements or computers that are connected over a network. The memory medium may store program instructions (e.g., embodied as computer programs) that may be executed by one or more processors.

As used herein, the terms "command" or "commands" refer to digital signals that represent computer instructions that are outputted by a computer for the purpose of controlling electronic, electro-mechanical or robotic devices that are part of the computer-controlled system disclosed herein.

Figure 1:
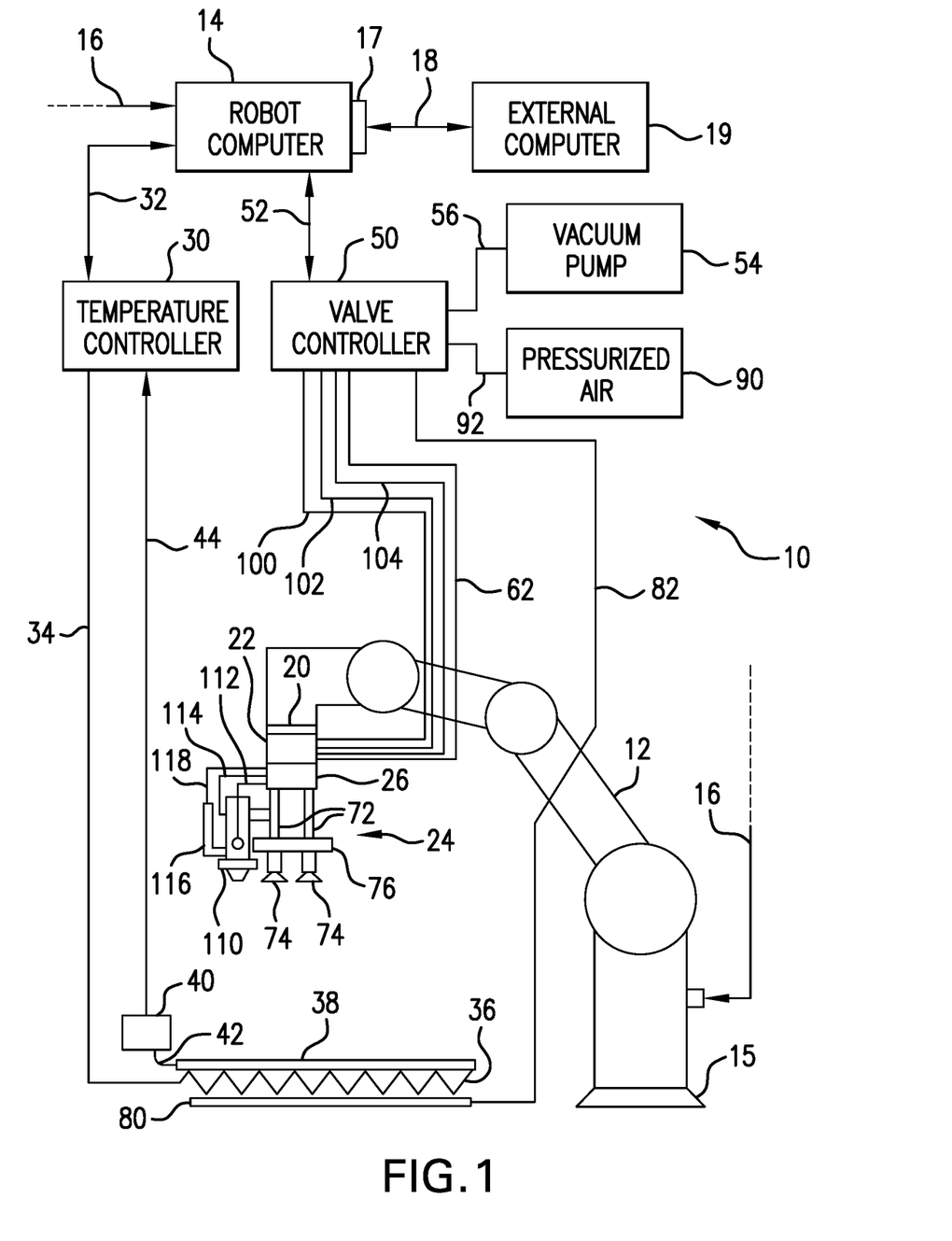
FIG. 1 is a block diagram of a computer-controlled system for additively fabricating a photovoltaic device in accordance with an exemplary embodiment of the present invention.

Referring to FIG. 1, there is shown system 10 that is used to implement a method of fabricating a solar cell panel in accordance with an exemplary embodiment of the invention. System 10 comprises programmable robotic arm 12 and robot computer 14. Robot computer 14 is in electronic data signal communication with robotic arm 12 via data bus 16. Robotic arm 12 is mounted on mobile pedestal 15 and further includes internal movement-effecting devices (not shown) that are in electronic data signal communication with robot computer 14 and translate the commands from robot computer 14 into the desired movement of robotic arm 12. Robot computer 12 includes a high-level graphical user interface (GUI) (not shown) for programming and controlling all components of system 10. Robot computer 14 includes one or more processors and at least one memory medium comprising computer readable code executable by the one or more processors. Robot computer 14 may be configured as a computer, such as a personal computer, notebook computer, laptop computer, desktop computer or tablet. Robot computer 14 includes a programming interface 17 that allows control by an external computer 19. In an exemplary embodiment, programming interface 17 is a TCP/IP port. External computer 19 is in electronic data signal communication with programming interface 17 via communication channel 18. Communication channel 18 may be configured as a wireless network or a bi-directional data bus. External computer 19 is configured to execute computer software programs that allow for virtual programming and simulation as well as controlling the components of system 10. One suitable commercially available computer program that may be executed on external computer 19 to enable such virtual programming and simulation is known as RoboDK and is manufactured by RoboDK, Inc. of Montreal, Canada.

In an exemplary embodiment, robotic arm 12 is configured as the Model UR3 Robotic Arm manufactured by Universal Robots A/S of Odense Denmark. The Model UR3 robotic arm is a six-axis collaborative robotic arm capable of handling a five (5) kilogram payload and which is mounted onto a mobile pedestal. Such a robotic arm is disclosed in U.S. Pat. No. 8,614,559, entitled "Programmable Robot and User Interface" and in U.S. Pat. No. 8,779,715, entitled "Programmable Robot and User Interface". The entire disclosures of U.S. Pat. Nos. 8,614,559 and 8,779,715 are hereby incorporated herein by reference.

As shown in FIG. 1, machine vision system 20 is attached or mounted to robotic arm 12. Machine vision system 20 is in electronic signal communication with robot computer 14. Machine vision system 20 recognizes and locates many two-dimensional shapes (e.g. circles, rectangles, squares and rings) without any scanning. For example, machine vision system 20 views features such as fiducial markers or reference indicia on the substrate and solar cells and also views the corners of the substrate and each solar cell. The user may input the dimensions of two-dimensional shapes into robot computer 14. Machine vision system 20 recognizes parts with few distinctive features and also recognizes multiple random part positions. In an exemplary embodiment, machine vision system 20 is configured as the commercially available "ROBOTIQ Wrist Camera" manufactured by Universal Robots A/S of Odense Denmark.

Referring to FIG. 1, automatic tool changer 22 is attached or mounted to robotic arm 12. Automatic tool changer 22 is configured to engage any one of a variety of tools that are to be used in implementing the steps of the fabrication method of the present invention. Each tool has a mating connector that allows the tool to be releasably or removably secured to tool changer 22. Tool 24, which is described in detail in the ensuing description, includes mating connector 26 that is configured to allow tool 24 to be releasably or removably secured to tool changer 22. Tool changer 22 allows robotic arm 12 to quickly replace a current tool with a different tool. Tool changer 22 is pneumatically controlled and includes pass-through connectors (not shown) that pass pressurized air to tool 24 and also allow vacuum pressure to be applied to tool 24. These features are discussed in detail in the ensuing description. The tools are positioned in a tool stand (not shown) that is located near robotic arm 12. Fiducial markers and other reference indicia allow machine vision system 20 to recognize the position of each tool in the tool stand. In an exemplary embodiment, automatic tool changer 22 is the commercially available ATI QC11 tool changer manufactured by ATI Industrial Automation, Inc. of Apex, N.C. In such an embodiment, the tool stand is specifically configured for use with the ATI QC11 tool changer and is also manufactured by ATI Industrial Automation.

System 10 further comprises temperature controller 30. Temperature controller 30 includes an electronic data signal input port (not shown) that is coupled to bi-directional data bus 32 in order to receive commands from robot computer 14. Temperature controller 30 includes an electrical signal output (not shown) that is coupled to electrical cable or wire 34. Electrical cable 34 is coupled to resistive platen heater 36. Heater 36 becomes heated upon receiving an electrical voltage having a predetermined voltage level from temperature controller 30 via electrical cable 34. The actual temperature to which heater 36 is heated depends upon the voltage level of the electrical voltage heater 36 receives via electrical cable 34. The heat generated by resistive platen heater 36 heats platen 38 to a predetermined temperature. The heat provided by the heat platen 38 facilitates curing of the polymers and adhesives used in the additive fabrication method of the present invention. In order to monitor that actual temperature of platen 38, system 10 includes thermocouple 40 that is coupled to platen 38 via thermally conductive member 42. Thermally conductive member 42 can be any suitable material that can transfer heat. Examples of suitable thermally conductive members include metal wires and strips of metal. Thermocouple 40 converts the temperature into a voltage that represents the measured temperature and which is fed to temperature controller 30 via electrical cable or wire 44. Temperature controller 30 includes an analog-to-digital converter that converts this voltage to a multi-bit digital signal that represents the current temperature of platen 38. Temperature controller 30 includes circuitry to compare this current temperature of platen 38 to a pre-set temperature provided by robot computer 14. Temperature controller 30 then determines whether platen 38 is at the correct temperature. If platen 38 is not at the correct temperature, then temperature controller 30 varies the amplitude of the electrical voltage on electrical cable 34 to increase or decrease the temperature of resistive platen heater 36 until the desired temperature is attained. Hence, temperature controller 30, resistive platen heater 36 and thermocouple 40 function as a feedback loop to control the temperature of platen 38.

Valve controller 50 is in electronic data signal communication with robot computer via bi-directional data signal bus 52. Electronic valve controller 50 includes electrically controlled valves that are controlled by commands outputted by robot computer 14. In such a configuration, the commands open and close the electrically controlled valves. In an exemplary embodiment, valve controller 50 is an electronically controlled valve manifold manufactured by the Festo Corporation of Islandia, N.Y. In an exemplary embodiment, bi-directional data bus 52 is configured as a Modbus Protocol network. In such an embodiment, Modbus commands from robot computer 14 trigger the valves in valve controller 50 so as to open and close. The Modbus commands also trigger the appropriate valves in valve controller 50 to control the vacuum force produced by vacuum pump 54 and control the pressurized air produced by pressurized air source 90. Vacuum pump 54 is in in communication with electronic valve controller 50 via vacuum hose or tube 56. Vacuum hose 56 is connected to corresponding electrically controlled valves in electronic valve controller 50. During the fabrication of the solar cell panels, vacuum pump 54 is always activated so that there is always a vacuum created within hose 56. One end of vacuum hose 62 is connected to the electrically controlled valve of controller 50 to which vacuum hose 56 is connected. The other end of vacuum hose 62 is connected to a corresponding pass-through connector (not shown) that is built into tool changer 22. In such a configuration, when vacuum pressure exists within vacuum hose 62, the pass-through connector in tool changer 22 provides this vacuum to a corresponding pass-through connector in mating connector 26 of tool 24. Tool 24 includes vacuum pick-up tool 70. Vacuum pick-up tool 70 comprises vacuum conduits 72, vacuum suction cups 74 and support member 76 to which vacuum conduits 72 and vacuum suction cups 74 are attached. A vacuum existing within vacuum conduits 72 will also exist at vacuum suction cups 74. Although the view in FIG. 1 shows two vacuum suction cups 74, vacuum pick-up tool 70 actually has four equidistantly spaced vacuum suction cups 74. When robot computer 14 outputs commands to electronic valve controller 50 to allow the vacuum produced by vacuum pump 54 to create a vacuum within vacuum hose 62, the corresponding pass-through connectors in tool changer 22 and in mating connector 26 allow the vacuum force within vacuum hose 62 to create a vacuum at vacuum suction cups 74. As a result of this configuration, tool 24 uses vacuum suction cups 74 to pick up the polymer substrates and the solar cells when implementing steps of the fabrication method of the present invention.

In some embodiments, there is a plurality of vacuum hoses that are connected between electronic valve controller 50 and tool changer 22 which provide a vacuum to vacuum pick-up tool 70.

As shown in FIG. 1, platen 38 includes vacuum intake device 80 that is connected to vacuum hose 82. Vacuum hose 82 is connected to a corresponding electrically controlled valve (not shown) located in valve controller 50 which is also connected to vacuum hose 56. When robot computer 14 generates a command to open the electrically controlled valve to which vacuum hose 82 is connected, a vacuum is created at vacuum intake device 80 under platen 38. This vacuum at platen 38 holds the polymer substrate down on platen 38 while robotic arm 12 performs steps of the fabrication method of the present invention.

Pressurized air source 90 is in communication with corresponding electrically controlled valves within valve controller 50 via air hose 92. When robot computer 14 outputs commands to open these electrically controlled valves that are connected to air hose 92, pressurized air is provided to air hoses 100, 102 and 104. Air hoses 100, 102 and 104 are connected to corresponding pneumatic pass-through connectors that are located in tool changer 22 and which are in communication with corresponding pneumatic pass-through connectors in mating connector 26. Tool 24 includes micro-spray valve 110 which is connected to air hoses 112 and 114. Micro-spray valve may be any suitable commercially available micro-spray valve. In an exemplary embodiment, micro-spray valve 110 is a commercially available Nordson EFD 781S General Purpose Spray Valve. Air hoses 112 and 114 are connected to mating connector 26 and are in communication with the pneumatic pass-through connectors in mating connector 26 that receive pressurized air from air hoses 100 and 102. Pressurized air in air hose 100 passes through air hose 112 and activates micro-spray valve 110. Pressurized air in air hose 102 passes through air hose 114 and enters micro-spray valve 110 and atomizes the material (e.g. liquid polyimide) as it exits micro-spray valve 110 such that the material is separated into micro droplets that are sprayed onto a substrate during the fabrication of the solar array panel. Tool 24 includes material feed tube 116 that holds an amount of material (e.g. liquid polyimide) that is fed to micro-spray valve 110. Air hose 118 is connected between material feed tube 116 and a corresponding pneumatic pass-through connector that is located within mating connector 26 and which receives pressurized air from air hose 104. The pressurized air that passes to material feed tube 116 pushes the material out of material feed tube 116 and into micro-spray valve 110. Robot computer 14 outputs commands to valve controller 50 to allow pressurized air is to pass through air hoses 100, 102 and 104 or to stop the pressurized air from flowing through these air hoses.

Figure 2:
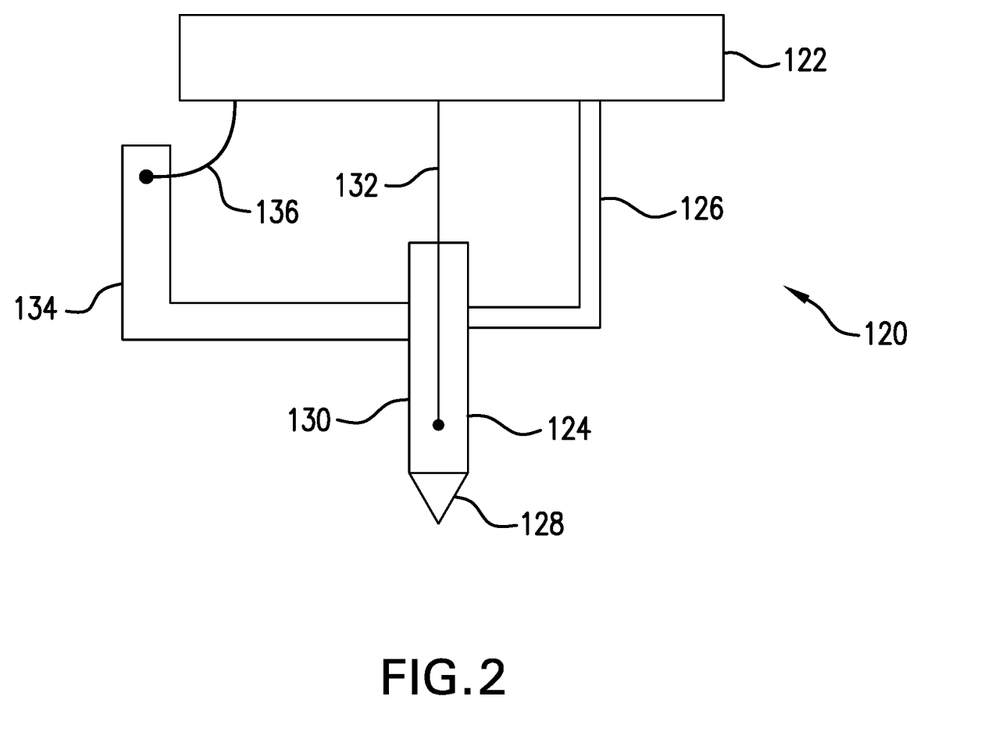
FIG. 2 is a side elevational view of a tool that is configured to be releasably secured to a robotic arm shown in FIG. 1.

Referring to FIG. 2, there is shown second tool 120 which is used by robotic arm 12 to implement particular steps of the fabrication method of the present invention. Tool 120 comprises mating connector 122 which is configured to be releasably or removably secured to tool changer 22. Mating connector 122 includes a plurality of pass-through connectors (not shown) that are configured to be aligned with the pass-through connectors in tool changer 22 when mating connector 122 is secured to tool changer 22. Tool 120 includes dispensing valve 124 that is attached to mating connector 122 by support member 126. Dispensing valve 124 includes spray tip 128 and valve body 130. Air hose 132 is connected between dispensing valve 124 and mating connector 122. Air hose 132 is in communication with a pass-through connector that is located in mating connector 120 and which is aligned and in communication with the pass-through connector in tool changer 22 that receives pressurized air from air hose 100. Pressurized air from air hose 100 triggers dispensing valve 124 thereby allowing material to be dispensed through spray tip 128. Material feed tube 134 contains substantially liquid material that is to be dispensed by dispensing valve 124. In an exemplary embodiment, material feed tube 134 contains an amount of electrically conductive ink. In an embodiment, the electrically conductive ink is silver conductive ink. Air hose 136 is connected between material feed tube 134 and mating connector 122. Air hose 136 is in communication with a pass-through connector that is located in mating connector 122 and which is aligned and in communication with the pass-through connector in tool changer 22 that receives pressurized air from air hose 102. Pressurized air from air hose 102 pushes the material in material feed tube 134 into dispensing valve 124. Dispensing valve 124 may be any suitable commercially available dispensing valve. In an exemplary embodiment, dispensing valve 124 is a commercially available TechCon TS5624DMP Diaphragm Valve.

The components of system 10 are positioned at the same workstation and can be positioned or mounted on a cart, table, workbench or other suitable platform. The raw materials used for fabricating the solar cell panels are also located at the same workstation.

Figure 3:
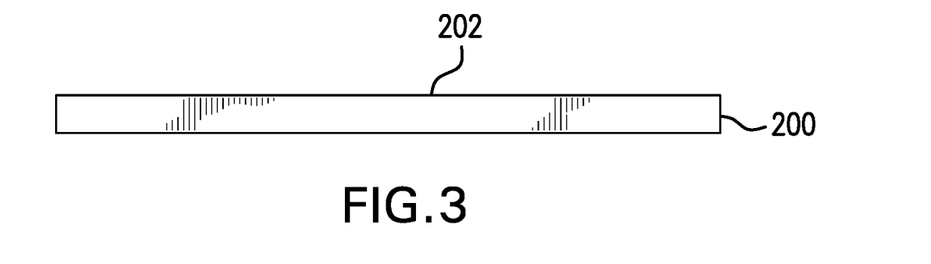
FIG. 3 is a side elevational view of a substrate used to fabricate the photovoltaic device.

Referring to FIG. 3, in an exemplary embodiment of the fabrication method of the present invention, pre-fabricated substrates 200 are used to fabricate the solar cell panels. Each substrate 200 may have any suitable size or shape. For example, each substrate 200 may have the shape of a rectangle and a size of 8½ inches by 11 inches. In an exemplary embodiment, each pre-fabricated substrate 200 comprises a non-thermosetting polymeric film. Suitable polymers include polyimides, polyolefins, polyvinyl chloride, polyamides, polyvinylidene chloride, polystyrene, polyethylene and terephthalate. In an exemplary embodiment, each pre-fabricated substrate 200 is a polyimide film. Each pre-fabricated substrate 200 is pre-marked with fiducial markers or reference indicia that can be recognized by machine vision system 20 on robotic arm 12. The fiducial markers or reference indicia can be any suitable notation, symbol, number, letter, etc. An inventory of substrates 200 is positioned in a tray or other suitable holding device that is near robotic arm 12.

In one embodiment, solar cells are positioned in a tray that is located at the workstation. The tray is divided into quadrants wherein one solar cell is positioned in each quadrant. Such a configuration allows the four vacuum suction cups 74 of vacuum pick-up tool 70 to pick up four solar cells simultaneously.

In a first step of the fabrication method, robot computer 14 issues a command to temperature controller 30 to output a predetermined voltage over electrical wire 34. This predetermined voltage is applied to resistive platen heater 36 which, in response, heats platen 38 to a predetermined temperature. The temperature of platen 38 remains at the predetermined temperature for the entire process of assembling the solar cell panel. The predetermined temperature is programmed into the computer software program executed by robot computer 14. The heat radiated by platen 38 facilitates curing the adhesive and conductive ink that is used in the fabrication method. However, the predetermined temperature may be varied depending upon the type of adhesive and conductive ink used in the fabrication method.

Robot computer 14 generates control signals to valve controller 50 to allow the vacuum force created by vacuum pump 54 to extend through vacuum hose 82 and into vacuum assembly 80 so as to create a vacuum at platen 38. The vacuum at platen 80 sucks or holds down substrate 200 to platen 38 while robotic arm 12 performs various operations. This configuration keeps substrate 200 stationary during the fabrication process.

Robotic arm 12 utilizes tool 24 to implement the first several steps of the fabrication method. Tool 24 was described in detail in the foregoing description. If tool 24 is not yet secured to tool changer 22, then robot computer 14 commands robotic arm 12 to retrieve tool 24 from the tool stand. Material feed tube 116 holds a substantially liquid, curable material that is used as an adhesive to bond solar cells 206 to substrate 200. The particular curable material has substantially the same Coefficient of Thermal Expansion (CTE) as the material from which substrate 200 is fabricated. In an exemplary embodiment, the curable material is a substantially liquid polyimide which is the same material from which substrates 200 are fabricated. The substantially liquid polyimide is to be used as an adhesive for attaching solar cells 206 to top surface 202 of substrate 200. The substantially liquid polyimide is referred to herein as an "adhesive" or an "adhesive layer".

In other exemplary embodiments, the curable material has a CTE that is different than the CTE of the material from which substrates 200 are fabricated. In such embodiments, the difference in Coefficients of Thermal Expansion is a desired characteristic of the fabricated solar cell panel.

Figure 4:
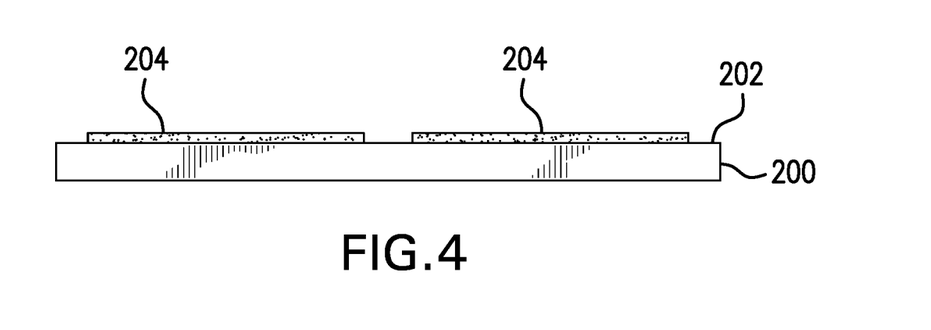
FIG. 4 is a side elevational view of the substrate having layers of adhesive deposited on the top surface thereof in accordance with an exemplary embodiment of the present invention.

Referring to FIG. 3, robot computer 14 commands robotic arm 12 to use vacuum pick-up tool 70 to pick up one substrate 200 and place it on platen 38. The vacuum at platen 38 holds substrate 200 stationary. Next, robotic arm 12 is controlled to pick up a plurality of solar cells 204 that are positioned in the tray near robotic arm 12. Since vacuum pick-up tool 70 has four equidistantly spaced vacuum suction cups 74, robotic arm 12 picks up four solar cells 206 simultaneously. Robotic arm 12 then moves over to substrate 200 which is now held stationary on platen 38. Machine vision system 20 scans top surface 202 of substrate 200 to determine the locations of the fiducial markers. These locations of the fiducial markers are processed by robot computer 14. Robot computer 14 issues commands to valve controller 30 to enable the flow of pressurized air through air hoses 100, 102 and 104 to activate micro-spray valve 110 and create material feed pressure in material feed tube 116 so as to push or force the substantially liquid polyimide into micro-spray valve 110. Robot computer 14 commands robotic arm 12 to move in a predetermined pattern that enables micro-spray valve 110 to spray the liquid polyimide on the area of top surface 202 of substrate 200 that is defined by the fiducial markers in order to form adhesive layers 204. As micro-spray valve 110 sprays the substantially liquid polyimide on top surface 202, the pressurized air from air hose 102 atomizes the liquid polyimide as it leaves micro-spray valve 110 as described in the foregoing description. FIG. 4 shows the resulting adhesive layers 204 on top surface 202 of substrate 200. While micro-spray valve 110 is spraying the liquid polyimide on top surface 202, vacuum pick-up tool 70 continues to hold the four solar cells 206.

Figure 5:
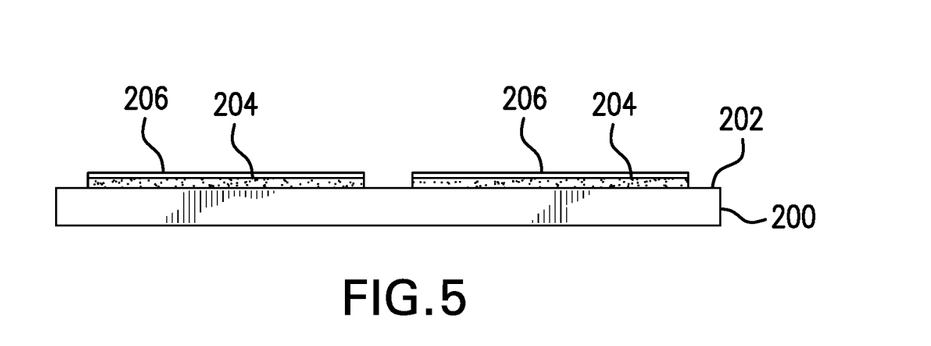
FIG. 5 is a side elevational view showing solar cells positioned on the layers of adhesive shown in FIG. 4.

When the spraying of adhesive layers 204 on top surface 202 of substrate 200 is complete, robot computer 14 issues commands to valve controller 30 to terminate pressurized air flowing through air hoses 100, 102 and 104. Next, robotic arm 12 uses machine vision system 20 and vacuum pick-up tool 70 to place the solar cells 206 in the correct locations on adhesive layers 204. When vacuum pick-up tool 70 has placed solar cells 206 in the correct locations, robot computer 14 issues commands to valve controller 30 to close the valves between vacuum pump 54 and vacuum hose 62 so as to terminate the vacuum force of vacuum suction cups 74. Once the vacuum force is terminated at vacuum suction cups 74, vacuum pick-up tool 70 releases the solar cells 206 on adhesive layers 204 as shown in FIG. 5.

Figure 6:
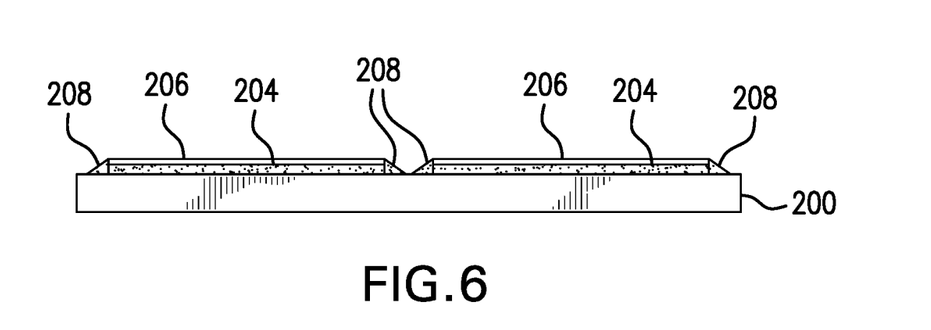
FIG. 6 is a side elevational view showing additional amounts of adhesive deposited about the perimeter of each solar cell.

Referring to FIG. 6, robot computer 14 issues commands to robotic arm 12 and to valve controller 30 that enable micro-spray valve 110 to sprays additional adhesive 208 along the perimeters or edges of each solar cell 206. Additional adhesive 208 is the same substantially liquid polyimide used to form adhesive layers 204. Applying additional adhesive 208 in these locations will seal solar cells 206 to substrate 200 thereby preventing electrically conductive ink, which is applied in the next step, from seeping under solar cells 206. Additional adhesive 208 also forms raised areas or "bridges" upon which electrically conductive ink will be printed. Each solar cell 206 includes fiducial markers thereon which are used by machine vision system 20 in the ensuing steps to form the electrical interconnections between solar cells 206 and electrical bus bars.

In the next step, adhesives 204 and 208 are allowed to cure for a predetermined amount of time referred to herein as the "cure time". Heater element 36 of platen 38 provides the necessary heat to cure adhesives 206 and 208. The cure time is programmed into the robot computer 14 and can be varied depending upon the type of material used as the adhesive. In an exemplary embodiment, the cure time is less than or equal to five minutes. During the cure time, robotic arm 12 does not perform any actions on substrate 200 or solar cells 206.

While adhesives 204 and 208 are curing, robot computer 14 controls robotic arm 12 to dock and release current tool 24 in the tool stand and to engage second tool 120 (see FIG. 2). After the cure time has elapsed and solar cells 206 are completely bonded to substrate 200, machine vision system 20 on robotic arm 12 observes the orientation and arrangement of solar cells 206 and the location of the fiducial marks on solar cells 206. Machine vision system 20 provides this vision information to robot computer 14. In response, robot computer 14 determines where robotic arm 12 is to be maneuvered so that tool 120 can form the electrical interconnections between solar cells 206 and the electrical bus bars.

Figure 7:
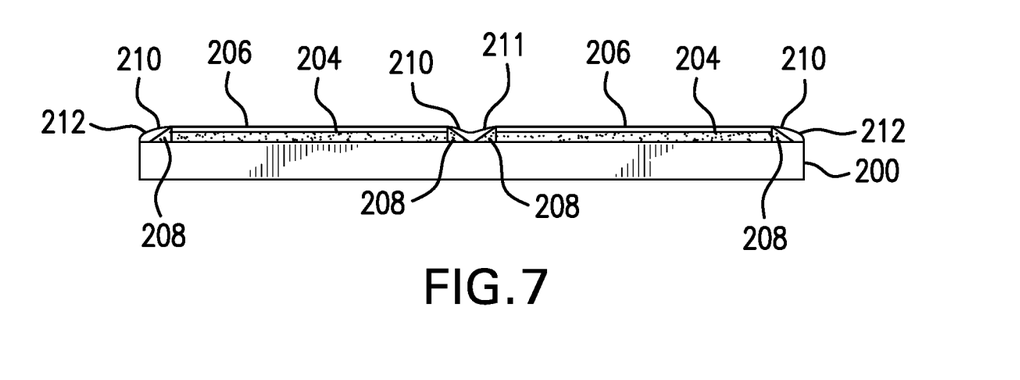
FIG. 7 is side elevational view showing electrically conductive ink deposited on the additional amounts of adhesive shown in FIG. 6.

Referring to FIG. 7, robot computer 14 issues commands that position robotic arm 12 for the deposition of electrically conductive ink on adhesive 208 that was deposited along the edges of each solar cell 206. Robot computer 14 then issues commands to valve controller 30 so that pressurized air from pressurized air source 90 passes through air hoses 100 and 102, the pass-through connectors of tool changer 20 and mating connector 122 and through air hoses 132 and 136. The pressurized air flowing in air hose 132 activates dispensing valve 124 and the pressurized air flowing in air hose 136 pushes or forces the electrically conductive ink through material feed tube 134 and into dispensing valve 124 wherein spray tip 128 prints the electrically conductive ink 210 on adhesive 208 to form electrical interconnections 211 between solar cells 206 and electrical bus bars 212 (see FIG. 7).

After dispensing valve 124 finishes printing electrical interconnections 211 and electrical bus bars 212, the electrically conductive ink is allowed to cure for a predetermined amount of time. The predetermined amount of time is programmed into robot computer 14 and may be varied depending upon the type of electrically conductive ink used. In an exemplary embodiment, the predetermined amount of time for curing the electrically conductive ink is less than or equal to five minutes. While the electrically conductive ink is curing, robot computer 14 controls robotic arm 12 to dock and release tool 120 in the tool stand and to dock and engage tool 24 which was described in the foregoing description.

Figures 8, 9:
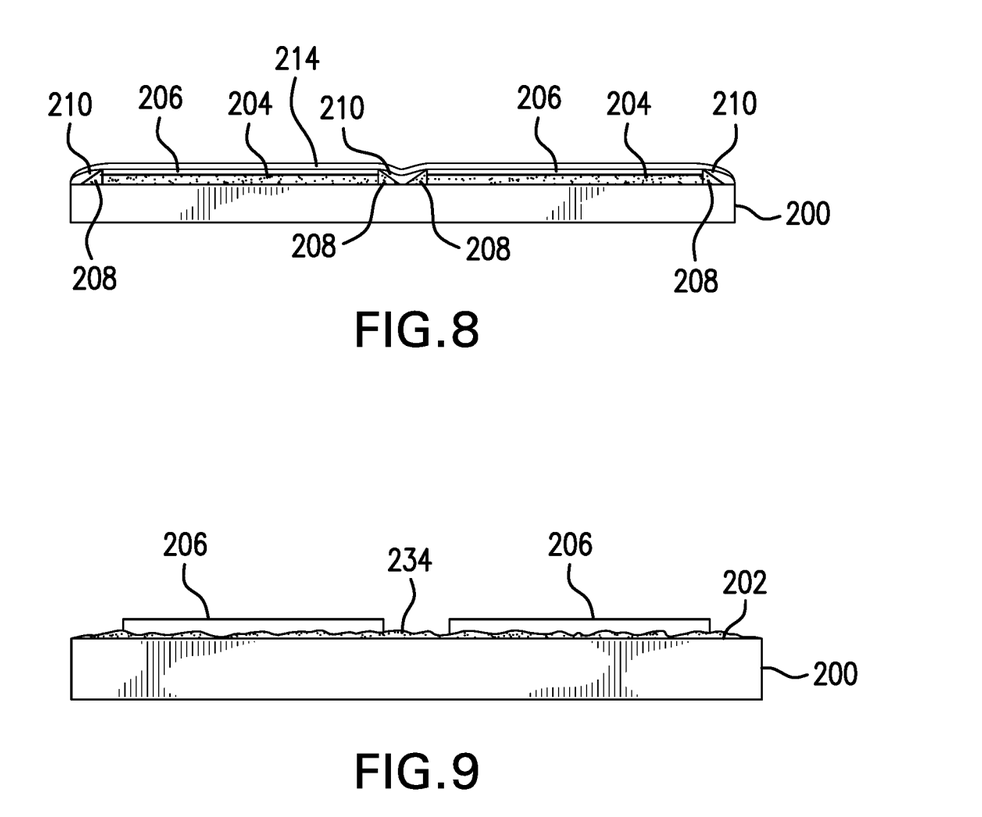
FIG. 8 is a side elevational view showing the completed solar cell panel encapsulated by a protective coating of material.
FIG. 9 is side elevational view showing an additively fabricated substrate deposited on a release structure or carrier in accordance with another exemplary embodiment of the present invention.

Referring to FIG. 8, the next step is to encapsulate solar cells 206 with a protective coating of material. The material used for encapsulation may be the same material used to form adhesives 204 and 208 or it may be another suitable material. Thus, in an exemplary embodiment, the material used for encapsulation is the same substantially liquid polyimide used as adhesives 204 and 208. Before robot computer 14 maneuvers robot arm 12 to spray the encapsulating material, machine vision system 20 scans solar cells 206 for fiducial markers and feeds this information back to robot computer 14. Robot computer 14 then maneuvers robotic arm 12 so that micro-spray valve 110 is positioned to spray the substantially liquid polyimide encapsulating material over solar cells 206. Robot computer 14 then issues commands to valve controller 30 so as to allow pressurized air from pressurized air source 90 to flow through air hoses 100, 102 and 104 so as to activate micro-spray valve 110 and create material feed pressure in material feed tube 116. As described in the foregoing description, the pressurized air atomizes the encapsulating material as it exits micro-spray valve 110 thereby separating the encapsulating material into micro-droplets which are sprayed over solar cells 206. Once the encapsulation step is complete, robot computer 14 controls valve controller 30 to terminate the supply of pressurized air to tool 24. The resulting encapsulation layer 214 is allowed to cure for a predetermined amount of time. In an exemplary embodiment, the cure time is less than or equal to five minutes. However, the cure time may vary depending upon the specific type of encapsulating material used.

After encapsulation layer 214 cures, the solar cell panel is complete. In an exemplary embodiment, robot computer 14 controls the robotic arm 12 to use vacuum pick-up tool 70 to pick up the completed solar panel and relocate it to another location at the workstation. Once this occurs, robot computer 14 controls the components of system 10 to repeat the entire process in order to fabricate another solar cell panel.

Referring to FIG. 9, in another exemplary embodiment of the fabrication method of the present invention, the chemical properties of the substrate are used to create a monolithic bond between the solar cells and the substrate. In such an embodiment, the solar cells are bonded to the substrate by dissolving the top layer of substrate 200 with a solution to create a "liquid bed". Solar cells 206 are then placed into the liquid bed. When the "liquid bed" cures, solar cells 206 are bonded to substrate 200. In an exemplary embodiment, the solution comprises a solvent and a solute wherein the solvent is a predetermined amount of liquid material. In one embodiment, the liquid material is a liquid version of the material used to fabricate substrate 200. Thus, if substrate 200 is made from polyimide, then the liquid material may be liquid polyimide. However, in other embodiments, the liquid material may be other liquid polymers. Suitable solvents include Diglyme and Methyl Ethyl Ketone (MEK). In an exemplary embodiment, the solution consists of 8.22% CP1 polyimide dissolved in 91.78% Diglyme. After the solution is deposited on substrate 200, liquid bed 234 is created and solar cells 206 are then placed in the liquid bed 234. When the solvent has completely evaporated, solar cells 206 are firmly integrated into the top layer of substrate 200. In order to implement this step of bonding solar cells 206 to substrate 200, robotic arm 12 engages a third tool (not shown). This third tool has a pneumatically actuated dispenser valve that receives pressurized air in the same manner as tool 24 and tool 120 described in the foregoing description. The third tool includes a material feed tube (not shown) that contains the solution. Robot computer 14, using the visual data captured by machine vision system 20, controls robotic arm 12 to move in a pattern that allows the dispenser valve of the third tool to deposit the solution to the correct area on top surface 202 of substrate 200 using the fiducial markers as references. The solvent dissolves the top layer of the polyimide substrate thereby forming liquid bed 234. Robot computer 14 then controls robotic arm 12 to release the third tool and engage tool 24. Robot computer 14 issues commands to valve controller 50 to allow the vacuum force produced by vacuum pump 54 to be applied to vacuum pick-up tool 70 as described in the foregoing description. Robotic arm 12 is then controlled so that vacuum pick-up tool 70 picks up solar cells 206 and places solar cells 206 on liquid bed 234 in the same manner in which robotic arm 12 placed solar cells 206 on adhesive layers 204 as described in the foregoing description. Once solar cells 206 are deposited on liquid bed 234, robot computer 14 issues commands to valve controller 30 to the vacuum at vacuum pick-up tool 70. Robot computer 14 then holds robotic arm 12 stationary for a predetermined amount of time until the solvent evaporates from the top layer of substrate 200. The heat provided heated platen 38 causes evaporation of the solvent and curing of the liquid polyimide. Once the solvent completely evaporates and the liquid polyimide is cured, the liquid bed 234 becomes solidified and solar cells 206 are now integrated into the top layer of substrate 200. The fabrication method then continues with the formation of the electrical interconnections and bus bars and application of the protective coating as described in the foregoing description.

In some embodiments, only a solvent (e.g. Diglyme, MEK, etc.) is applied to top surface 202 of substrate 200 in order to dissolve top surface 202 so as to create the liquid bed 234.

Figure 10:
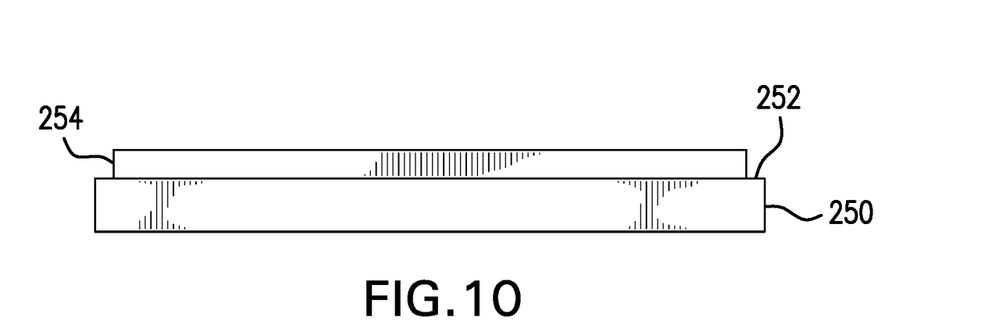
FIG. 10 is a side elevational view showing solar cells positioned in a liquid bed of material formed on the top surface of a substrate in accordance with another exemplary embodiment of the present invention.

Referring to FIG. 10, in another exemplary embodiment of the fabrication method of the present invention, the substrate is not a pre-fabricated substrate but instead, is additively fabricated in situ by system 10. In such an embodiment, robot computer 14 controls robotic arm 12 to engage tool 24 and use vacuum pick-up tool 70 to pick up carrier or release structure 250 from a tray located near robotic arm 12 and place carrier 250 on platen 38. Carrier 250 has top surface 252. In an exemplary embodiment, carrier 250 is fabricated from glass. In another embodiment, carrier 250 is fabricated from plexiglass. Other suitable materials may be used as carrier 250 provided such materials have a melting temperature significantly higher than the temperature of heated platen 38. The vacuum at platen 38 holds carrier 250 stationary. In one embodiment, material feed tube 116 contains the liquid polyimide described in the foregoing description. However, any suitable material, including the polymers discussed in the foregoing description, may be used to form the substrate on carrier 250. Robot computer 14 issues commands to valve controller 30 to enable pressurized air to flow through air hoses 100, 102 and 104. Robot computer 14 also issues commands that cause robotic arm 12 to move in the required patterns so that micro-spray valve 110 can spray the liquid polyimide on top surface 252 of carrier 250. In an exemplary embodiment, carrier 250 has fiducial markers that are recognized by machine vision system 20 and processed by robot computer 14 to ensure the liquid polyimide is deposited in the correct locations on carrier 250. After the liquid polyimide is sprayed onto carrier 250, the liquid polyimide is allowed to cure for a predetermined amount of time (i.e. cure time). The cure time depends upon the temperature of platen 38, the thickness of carrier 250 and the thickness of the sprayed layer of polyimide. As the sprayed polyimide layer cures, it transforms into a solid polyimide substrate 254. Once the cure time elapses, the solar cells can then be bonded to the resulting polyimide substrate 254 using the "adhesive layer" or "liquid bed" techniques described in the foregoing description. After the solar cells are bonded to the substrate, then electrical connections and bus bars are formed in accordance with the method steps described in the foregoing description. After the electrical connections and bus bars are formed and cured, then the substrate, electrical connections and bus bars and solar cells are encapsulated by the method steps described in the foregoing description. Robotic arm 12 is then controlled to use vacuum pick-up tool 70 to pick up the finished solar cell panel and move it to another location at the work station where finished solar cell panels are being placed or stacked. The completed solar cell panel is then peeled off or released from carrier 250. Carrier 250 is then cleaned so it can be reused.

The software programs executed by robot computer 14 may be modified or revised depending upon the materials used and the particular embodiment of the fabrication method of the present invention that is to be implemented.

In other exemplary embodiments of the present invention, system 10 is configured to print solar cells on the substrate in situ.

The present invention provides many advantages and benefits. All fabrication steps are self-contained on a single platform which is driven by the robotic arm. None of the fabrication steps are implemented or effectuated by humans. The machine vision system of the robotic arm provides fully-automated production of completed thin-film solar cell panels. The robotic arm has built-in scalability through the use of roll-to-roll production and/or a multiple-head gantry system. The robotic arm places or positions the solar cells on the substrate via automated pick and place. The solar cells may be arranged in either series or parallel circuits on the substrate. Electrical connections are printed on the substrate thereby eliminating the need for pre-manufactured metallic interconnections, soldering, sintering or welding. The solar cell panel is encapsulated without using conventional lamination or evaporation techniques. The method of the present invention allows for the use of any one of a variety of commercially available solar cells and is therefore not restricted to any particular type of solar cell. The fabrication method of the present invention is adaptable for in-space fabrication of solar cell panels or arrays. The fabrication method of the present invention can be used with fully printed solar cells thereby allowing low cost, automated production of an entirely 3D printed solar cell panel.

Reference in the specification to "an exemplary embodiment", "one embodiment" or "an embodiment" means that a particular feature, structure or characteristic described in connection with the embodiment is included in at least one embodiment of the invention. The appearances of the phrases "an exemplary embodiment", "one embodiment" or "an embodiment" in various places in the specification are not necessarily all referring to the same embodiment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method for fabricating a photovoltaic device using a computer-controlled system, the system comprising a first tool comprising a pneumatically actuated first dispensing device, a supply of a substantially liquid curable first material and a device to pick up components that are to be used in the photovoltaic device, a second tool comprising a pneumatically actuated second dispensing device and a supply of a liquid curable second material that is electrically conductive, a heated platen having a work surface for receiving components that are to be used in the photovoltaic device, a pressurized air source to provide pressurized air, a manifold in pneumatic communication with the pressurized air source to control application of pressurized air to the first dispensing device and the second dispensing device and a robotic device having a vision system, wherein the robotic device and the first tool and the second tool are configured to allow the first tool and second tool to be removably secured to the robotic device, the system further comprising a computer to control the manifold and the robotic device, the method comprising the steps of:

controlling the robotic device to use the first tool to pick up a substrate and place the substrate on the work surface of the heated platen, the substrate having a top surface;

controlling the manifold to allow pressurized air to flow to the first tool to actuate the first dispensing device to allow the first material to exit the first dispensing device and controlling the robotic arm to maneuver in a pattern so as to allow the first material to be deposited upon the top surface of the substrate;

controlling robotic device to use the first tool to place at least one thin film solar cell on the first material that has been deposited on the substrate, wherein the at least one thin film solar cell has a perimeter;

controlling the manifold to allow pressurized air to flow to the first tool to actuate the first dispensing device to allow the additional amounts of first material to exit the first dispensing device and controlling the robotic device to maneuver in a pattern so as to allow the additional amounts of first material to be deposited about the perimeter of the at least one thin film solar cell;

curing the first material with heat provided by the heated platen in order to allow the at least one thin film solar cell to become bonded and sealed to the substrate;
controlling the robotic device to release the first tool and engage the second tool;
controlling the manifold to allow pressurized air to flow to the second tool to actuate the second dispensing device so as to allow the second curable material to exit the second dispensing device and controlling the robotic arm to maneuver in a pattern so as to allow the second material to be deposited upon cured additional amounts of the first material so as to form at least one electrically conductive trace that is electrically coupled to the thin film solar cell;
curing the second material with heat provided by the heated platen;
controlling the robotic device to release the second tool and engage the first tool;
controlling the manifold to allow pressurized air to flow to the first tool to actuate the first dispensing device to apply a protective coating of the first material over the at least one thin film solar cell and the electrically conductive trace; and
curing the protective coating of the first material using heat provided by the heated platen.

2. The method according to claim 1 further comprising:
a vacuum producing device in communication with the manifold;
wherein the device to pick up components of the first tool comprises a vacuum pick-up tool which uses a vacuum produced by the vacuum producing device to pick up the substrate and the at least one thin film solar cell; and
wherein the manifold allows the vacuum produced by the vacuum producing device to be applied to the vacuum pick-up tool upon receiving commands from the computer.

3. The method according to claim 1 wherein the vision system of the robotic device captures visual data corresponding to the geometries and sizes of the substrate and the at least one thin film solar cell and locations of fiducial markers on the substrate and the at least one thin film solar cell and wherein the visual data is processed by the computer which, in response, outputs commands that causes the robotic device to maneuver in accordance with processed visual data.

4. The method according to claim 1 wherein the apparatus further comprises a temperature controller that receives commands from the computer and controls the temperature of the heated platen.

5. The method according to claim 1 wherein the first material is a polyimide and the second material is an electrically conductive ink.

6. The method according to claim 1 wherein first dispensing valve comprises a micro-spray valve, wherein pressurized air actuates the micro-spray valve and atomizes the first material as it exits the micro-spray valve so as to separate the first material into micro-droplets.

7. The method according to claim 1 wherein the robotic device comprises a robotic arm.

8. A method for fabricating a photovoltaic device using a computer-controlled system, the system comprising a first tool comprising a pneumatically actuated first dispensing device, a supply of a substantially liquid curable first material and a device to pick up components that are to be used in the photovoltaic device, the system further comprising a second tool comprising a pneumatically actuated second dispensing device and a supply of a liquid curable second material that is electrically conductive, a heated platen having a work surface for receiving components that are to be used in the photovoltaic device, a pressurized air source to provide pressurized air, a manifold in pneumatic communication with the pressurized air source to control the flow of pressurized air to the first dispensing device and the second dispensing device and a robotic device having a vision system, wherein the robotic device and the first tool and the second tool are configured to allow the first tool and second tool to be removably secured to the robotic device, the system further comprising a computer to control the manifold and the robotic device, the method comprising the steps of:
controlling the robotic device to use the first tool to pick up a carrier and place the carrier on the work surface of the heated platen, wherein the carrier has a top surface;
controlling the manifold to allow pressurized air to flow to the first tool to actuate the first dispensing device to allow the first material to exit the first dispensing device and controlling the robotic arm to maneuver in a pattern so as to allow the first material to be deposited upon the top surface of the carrier;
curing the first material that was deposited upon the top surface of the carrier with the heated platen so as to form a substrate having a top surface;
controlling the manifold to allow pressurized air to flow to the first tool to actuate the first dispensing device to allow the first material to exit the first dispensing device and controlling the robotic arm to maneuver in a pattern so as to allow a layer of the first material to be deposited upon the top surface of the substrate;
controlling robotic device to use the first tool to place at least one thin film solar cell on the layer of the first material, wherein the at least one thin film solar cell has a perimeter;
controlling the manifold to pressurized air to flow to the first tool to actuate the first dispensing device to allow additional amounts of the first material to exit the first dispensing device and controlling the robotic device to maneuver in a pattern so as to allow the additional amounts of the first material to be deposited about the perimeter of the at least one thin film solar cell;
curing the first material with heat provided by the heated platen in order to allow the at least one thin film solar cell to become bonded and sealed to the substrate;
controlling the robotic device to release the first tool and engage the second tool;
controlling the manifold to allow pressurized air to flow to the second tool to actuate the second dispensing device so as to allow the second material to exit the second dispensing device and controlling the robotic arm to maneuver in a pattern so as to allow the second material to be deposited upon cured additional amounts of the first material so as to form at least one electrically conductive trace that is electrically coupled to the thin film solar cell;
curing the second material with heat provided by the heated platen;
controlling the robotic device to release the second tool and engage the first tool;
controlling the manifold to allow pressurized air to flow to the first tool to actuate the first dispensing device to apply a protective coating of the first material over the at least one thin film solar cell and the electrically conductive trace; and
curing the protective coating of the first material using heat provided by the heated platen.

9. The method according to claim 8 further comprising:
a vacuum producing device in communication with the manifold;
wherein the device to pick up components of the first tool comprises a vacuum pick-up tool which uses a vacuum produced by the vacuum producing device to pick up the substrate and the at least one thin film solar cell; and
wherein the manifold allows the vacuum produced by the vacuum producing device to be applied to the vacuum pick-up tool upon receiving commands from the computer.

10. The method according to claim 8 wherein the robotic device comprises a robotic arm and the vision system captures visual data corresponding to the geometries and sizes of the carrier, the substrate and the at least one thin film solar cell and locations of fiducial markers on the carrier and the at least one thin film solar cell and wherein the visual data is processed by the computer which, in response, outputs commands that causes the robotic arm to maneuver in accordance with processed visual data.

11. The method according to claim 8 wherein the apparatus further comprises a temperature controller that receives commands from the computer and controls the temperature of the heated platen.

12. The method according claim 8 wherein the carrier is fabricated from glass.

13. The method according to claim 8 wherein the first material is a polyimide and the second material is an electrically conductive ink.

14. The method according to claim 8 wherein first dispensing valve comprises a micro-spray valve, wherein pressurized air actuates the micro-spray valve and atomizes the first material as it exits the micro-spray valve so as to separate the first material into micro-droplets.

15. A method for fabricating a photovoltaic device using a computer-controlled system, the system comprising a first tool comprising a pneumatically actuated first dispensing device, a supply of a substantially liquid curable first material and a device to pick up components that are to be used in the photovoltaic device, a second tool comprising a pneumatically actuated second dispensing device and a supply of a liquid curable second material that is electrically conductive, a third tool comprising a pneumatically actuated third dispensing device having a supply of a liquid comprising a solvent, a heated platen having a work surface for receiving components that are to be used in the photovoltaic device, a pressurized air source to provide pressurized air, a manifold in pneumatic communication with the pressurized air source to control the flow of pressurized air to the first dispensing device, the second dispensing device and the third dispensing device and a robotic device having a vision system, wherein the robotic device and the first tool, the second and third tool are configured to allow the first tool, the second tool and the third tool to be removably secured to the robotic device, the system further comprising a computer to control the manifold and the robotic device, the method comprising the steps of:
controlling the robotic device to use the first tool to pick up a substrate and place the substrate on the work surface of the heated platen, the substrate having a top surface and being made from a solid third material;
controlling the manifold to allow flow of pressurized air to the third tool to actuate the third dispensing device to allow the liquid comprising the solvent to exit the third dispensing device and controlling the robotic device to maneuver in a pattern so as to cause the liquid comprising the solvent to be deposited upon the top surface of the substrate in order to dissolve and liquefy the solid third material so as to form a liquid bed comprising the liquefied third material and the liquid comprising the solvent;
controlling the robotic device to release the third tool and engage the first tool;
controlling robotic device to use the first tool to place at least one thin film solar cell on the liquid bed, wherein the at least one thin film solar cell has a perimeter;
evaporating the solvent in the liquid bed and curing the liquified third material with the heated platen so that the at least one thin film solar cell becomes integrated into the top surface of the substrate;
controlling the robotic device to release the first tool and engage the second tool;
controlling the manifold to allow flow of pressurized air to the second tool to actuate the second dispensing device so as to allow the second material to exit the second dispensing device and controlling the robotic arm to maneuver in a pattern so as to allow the second material to be deposited upon the substrate so as to form at least one electrically conductive trace that is electrically coupled to the at least one thin film solar cell;
curing the second material with heat provided by the heated platen;
controlling the robotic device to release the second tool and engage the first tool;
controlling the manifold to allow flow of pressurized air to the first tool to actuate the first dispensing device to apply a protective coating of the first material over the at least one thin film solar cell and the electrically conductive trace; and
curing the protective coating of the first material using heat provided by the heated platen.

16. The method according to claim 15 wherein the robotic device comprises a robotic arm and the vision system captures visual data corresponding to the geometries and sizes of the substrate and the at least one thin film solar cell and locations of fiducial markers on the substrate and the at least one thin film solar cell and wherein the visual data is processed by the computer which, in response, outputs commands that causes the robotic arm to maneuver in accordance with processed visual data.

17. The method according to claim 15 wherein the system further comprises a temperature controller that receives commands from the computer and controls the temperature of the heated platen.

18. The method according to claim 15 wherein the first material is a substantially liquid polyimide, the second material is an electrically conductive ink and the solid third material is polyimide.

19. The method according to claim 15 wherein the solvent is diglyme.

20. The method according to claim 15 wherein the liquid comprising the solvent comprises a liquified polyimide dissolved in diglyme.

* * * * *